US011770640B2

(12) United States Patent
Cotteleer

(10) Patent No.: US 11,770,640 B2
(45) Date of Patent: Sep. 26, 2023

(54) ANALOG-TO-DIGITAL CONVERTER FOR AN IMAGE SENSOR

(71) Applicant: ams Sensors Belgium BVBA, Antwerp (BE)

(72) Inventor: Wesley Cotteleer, Antwerp (BE)

(73) Assignee: AMS SENSORS BELGIUM BVBA, Antwerp (BE)

( * ) Notice: Subject to any disclaimer, the term of this patent is extended or adjusted under 35 U.S.C. 154(b) by 110 days.

(21) Appl. No.: 17/440,327

(22) PCT Filed: Feb. 5, 2020

(86) PCT No.: PCT/EP2020/052836
§ 371 (c)(1),
(2) Date: Sep. 17, 2021

(87) PCT Pub. No.: WO2020/187482
PCT Pub. Date: Sep. 24, 2020

(65) Prior Publication Data
US 2022/0150438 A1 May 12, 2022

(30) Foreign Application Priority Data
Mar. 20, 2019 (EP) .................... 19164047

(51) Int. Cl.
*H04N 25/772* (2023.01)
*H03M 1/00* (2006.01)
(Continued)

(52) U.S. Cl.
CPC .......... *H04N 25/772* (2023.01); *H03M 1/002* (2013.01); *H03M 1/0624* (2013.01);
(Continued)

(58) Field of Classification Search
CPC .... H04N 25/772; H04N 25/745; H04N 25/75; H04N 25/771; H03M 1/002; H03M 1/0624; H03M 1/123; H03M 1/56
See application file for complete search history.

(56) References Cited

U.S. PATENT DOCUMENTS 7,880,662 B2 * 2/2011 Bogaerts .............. H04N 25/616
341/169
9,041,579 B2 5/2015 Meynants et al.
(Continued)

OTHER PUBLICATIONS

International Search Report and Written Opinion in corresponding International Application No. PCT/EP2020/052836 dated May 6, 2020, 12 pages.
(Continued)

*Primary Examiner* — Nhan T Tran
(74) *Attorney, Agent, or Firm* — MH2 TECHNOLOGY LAW GROUP LLP

(57) ABSTRACT

An analog-to-digital converter for an image sensor comprises a counter circuit to generate a respective counter bit in response to a counter state of the counter circuit, and a storage circuit for storing a respective storage state in response the respective counter bit. The converter further comprises a comparator circuit for generating a level of a comparison signal, and a synchronization circuit to generate a write control signal for controlling the storing of the respective storage state in the respective storage cell. The counter circuit is configured to change the counter state, when a first edge of a cycle of the clock signal is applied to the counter circuit, and to generate the write control signal, when a second edge of the cycle of the clock signal being subsequent to the first edge of the cycle of the clock signal is applied to the synchronization circuit.

13 Claims, 12 Drawing Sheets

(51) Int. Cl.
   *H03M 1/06* (2006.01)
   *H04N 25/75* (2023.01)
   *H04N 25/71* (2023.01)
   *H04N 25/771* (2023.01)

(52) U.S. Cl.
   CPC ........... *H04N 25/745* (2023.01); *H04N 25/75* (2023.01); *H04N 25/771* (2023.01)

(56) References Cited

U.S. PATENT DOCUMENTS

| | | |
|---|---|---|
| 9,357,151 B1 | 5/2016 | Milkov |
| 2005/0057389 A1* | 3/2005 | Krymski ................ H03K 4/026 341/169 |
| 2006/0012696 A1 | 1/2006 | Zarnowski et al. |
| 2011/0115663 A1 | 5/2011 | Bogaerts |
| 2011/0205100 A1 | 8/2011 | Bogaerts |
| 2012/0112940 A1* | 5/2012 | Sohn ..................... H03M 1/162 341/155 |
| 2015/0381183 A1* | 12/2015 | Schultz ................ H03M 1/001 377/118 |
| 2017/0099422 A1* | 4/2017 | Goma .................. H04N 25/772 |

OTHER PUBLICATIONS

Chu, D., "Phase Digitizing: A New Method for Capturing and Analyzing Spread-Spectrum Signals", Hewleti-Packard Journal, Feb. 1989, pp. 28-35.

Wang, X. et al,"A low power counting method in ramp ADCs used in CMOS Image sensors", International Image Sensor Workshop 2013, Jun. 12-16, 2013, 4 pages.

Korean Office Action issued in corresponding Korean Application No. 10-2021-7030048 dated Mar. 16, 2023, with English language translation, 7 pages.

First Office Action issued in corresponding Chinese Application No. 202080022200.0 dated Apr. 28, 2023, with English language translation, 10 pages.

\* cited by examiner

ANALOG-TO-DIGITAL CONVERTER FOR AN IMAGE SENSOR

CROSS-REFERENCE TO RELATED APPLICATIONS

The present application is the national stage entry of International Patent Application No. PCT/EP2020/052836, filed on Feb. 5, 2020, and published as WO 2020/187482 A1 on Sep. 24, 2020, which claims the benefit of priority of European Patent Application No. 19164047.3, filed on Mar. 20, 2019, all of which are incorporated by reference herein in their entirety.

TECHNICAL FIELD

The disclosure relates to an analog-to-digital converter for an image sensor which may be used to read out the voltages of an array of pixels of the image sensor. The disclosure further relates to an image sensor comprising the analog-to-digital converter to read out the voltages of the array of pixels of the image sensor.

BACKGROUND

Image sensors commonly use analog-to-digital converters (ADCs) to read out the voltages of an array of pixels of the image sensors. The ADCs used for the application of image sensors may be embodied as group-parallel single-slope ADCs. In this particular type of ADC, a comparator circuit compares a group voltage level, for example a column voltage level, of a pixel of the pixel group, for example a pixel of a pixel column, with a periodic ramp voltage. The time between the ramp start and the toggling of the output of the comparator circuit is tracked using an n-bit counter circuit. The output signal, for example output bits, of the counter circuit serve as a digital representation of the column voltage. The value is usually stored after the conversion.

There is a desire to provide an analog-to-digital converter for an image sensor which is able to convert analog to digital signals with high speed, while minimizing the power and area consumption needed. Furthermore, there is a need to provide an image sensor using an analog-to-digital converter to convert read-out voltages of an array of pixels to digital values with high speed, while minimizing the power and area consumption is provided.

SUMMARY

An embodiment of an analog-to-digital converter for an image sensor which allows to convert analog signals to digital signals with increased speed and, which has a low power consumption and a small area consumption is specified in claim 1.

According to an embodiment of the analog-to-digital converter for an image sensor, the analog-to-digital converter comprises a counter circuit having a counter control connection to apply a clock signal and a plurality of counter output connections to generate a respective counter bit in response to a counter state of the counter circuit. The analog-to-digital converter further comprises a storage circuit comprising a plurality of storage cells. A respective one of the storage cells is connected to a respective one of the counter output connections for storing a respective storage state in response the respective counter bit. The analog-to-digital converter further comprises a comparator circuit for generating a level of a comparison signal in response to a comparison of an input signal and a reference signal, and a synchronization circuit to apply the comparison signal and the clock signal and to generate a write control signal for controlling the storing of the respective storage state in the respective storage cell.

The counter circuit is configured to change the counter state, when a first edge of a cycle of the clock signal is applied to the counter control connection of the counter circuit. The synchronization circuit is configured to generate the write control signal in response to a level of the comparison signal, when a second edge of the cycle of the clock signal being subsequent to the first edge of the cycle of the clock signal is applied to the synchronization circuit.

The analog-to-digital converter needs only a small silicon area and has a low power consumption. This in turn improves the speed of the circuit, since supply drops can be made small. The lower area and power consumption as well as the high speed for conversion of analog-to-digital signals is especially an advantage for image sensors with a low pixel pitch and a large number of pixels, and thus a large amount of parallelism. Furthermore, the analog-to-digital converter allows to scale well to smaller technology nodes where the level of supply voltages is reduced and transistor mismatch is increased.

The counter circuit may be embodied to generate a respective counter bit at the counter output connections in response to the clock signal applied to the counter control connection. The counter circuit may be embodied to generate a new counter bit at each of the counter output connections on every rising or falling edge of the clock signal. The synchronization circuit is also controlled by the clock signal. However, in comparison to the counter circuit, the output of the write control signal at the synchronization output connection is synchronized by the synchronization circuit to the opposite edge (rising or falling) of the clock signal. The write control signal is then used to latch the counter bits generated by the counter circuit into the storage cells of the storage circuit. The addition of the synchronization circuit enables time to be provided for the counter circuit to settle within half of a clock period of a clock cycle of the clock signal, enabling the use of asynchronous counter cells. This also enables the architecture to be extended by adding more counters on different clock phases of the clock signal.

According to an embodiment of the analog-to-digital converter, the converter comprises a latch circuit to generate a delayed write control signal being delayed in relation to the write control signal. The latch circuit is connected to a synchronization output connection of the synchronization circuit so that the write control signal is applied to a first portion of storage cells, and the delayed write control signal is applied to a second portion of storage cells. The first portion of the storage cells may be connected to the counter circuit to store low significant bits (LSBs) so that the storage cells of the first portion of the memory cells are configured as LSB memory cells. The second portion of the storage cells is connected to counter output connections of the counter circuit to store Most Significant Bits (MSBs) so that the storage cells of the second portion of the storage circuit are configured as MSB memory cells.

The latch circuit enables that the control signal for storing the Most Significant Bits is delayed when the MSB counter bits toggle on a rising edge of the clock signal. This provides more time for the counter circuit to settle the MSB counter bits, which enables ripple counter cells to be used for generating all of the counter bits in the counter circuit, instead of only using ripple counter cells for the generation of the low significant counter bits. The speed and power consumption of the analog-to-digital converter can be further optimized by particular embodiments of the synchronization circuit, the latch circuit and the storage circuit. In particular, the storage cells may be embodied such that only a single-ended input needs to be distributed over the storage cells of the storage circuit. Furthermore, the storage cells may be configured such that only a single-ended write control signal is needed, thereby avoiding skew issues. Moreover, by using True Single Phase Clock (TSPC) cells for both the synchronization circuit and the latch circuit, the load on the clock signal and the control signal to control the latch circuit can be minimized.

An embodiment of an image sensor using an analog-to-digital converter to convert read-out voltages of an array of pixels to digital values with high speed, while minimizing the power and area consumption is specified in claim 10.

According to an embodiment, the image sensor comprises a pixel array including at least two pixel groups, each pixel group comprising a plurality of pixels connected to a respectively associated group bus of that pixel group. The image sensor further comprises an analog-to-digital converter being embodied according to one of the claims 1 to 9. The analog-to-digital converter is configured to read out voltage values of the pixels of the pixel array.

The analog-to-digital converter may be configured as a group-parallel analog-to-digital converter, for example a column-parallel analog-to-digital converter, so that the group/column ADC structure can be split up for a design with N-pixel groups/columns of a pixel array in a structure with a sub-set of K-distributed counters, each driving M-pixel columns (N=K×M). In particular, the elements with the highest power consumption of the ADC, i.e. the counter elements to generate the low significant counter bits, are shared between M groups/columns of pixels, reducing the power consumption. In the shared counter circuit on the other hand, there is no digital switching inside the column on every count of the counter circuit. The layout of the circuit can be optimized with respect to area and power, since it is not constrained to the group/column pitch which allows for a more efficient and less power-consuming internal routing of the counter bits. Furthermore, the circuit configuration of the analog-to-digital converter does not rely on low-voltage signals and sense amplifiers to share the counter values across multiple columns.

The analog-to-digital converter is expected to be scalable, both technology-wise by fewer issues with downscaling due to lower supply voltages and higher mismatch in smaller technology nodes, and speed-wise, for example by adding counters on different clock phases to increase the speed. Moreover, the design of the basic elements of the analog-to-digital converter is characterized by low complexity, for example by use of ripple counters.

The accompanying drawings are included to provide a further understanding and are incorporated in and constitute a part of this specification. The drawings illustrate several embodiments of an analog-to-digital converter and an image sensor including the analog-to-digital converter, and together with the description serve to explain principles and the operation of the various embodiments of the analog-to-digital converter and the image sensor.

DETAILED DESCRIPTION

Figure 1:
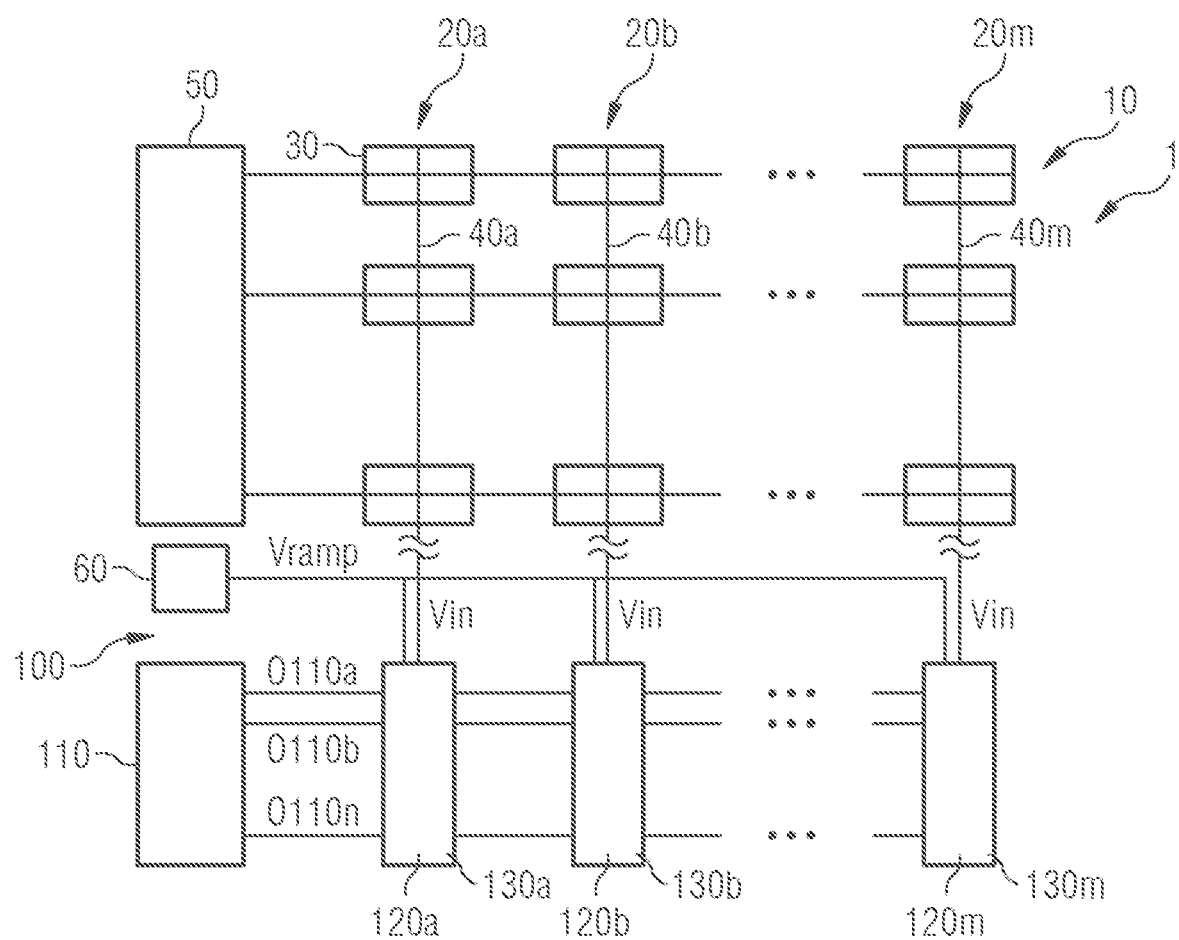
FIG. 1 shows an embodiment of an image sensor comprising a column-parallel analog-to-digital converter to read out voltages of an array of pixels.

FIG. 1 shows an embodiment of an image sensor 1 comprising a pixel array 10 including a plurality of pixel groups 20a, 20b, ..., 20m, for example pixel columns. Each of the pixel groups/columns 20a, 20b, ..., 20m comprises a plurality of pixels 30 connected to a respectively associated group/column bus 40a, 40b, ..., 40m of the respective pixel group/column.

The image sensor further comprises a row selection circuit 50 to select one of the pixel rows for reading out the content of the pixels arranged in the selected row. The image sensor 1 further comprises an analog-to-digital converter 100 being configured to read out voltage levels of the pixels 30 of the pixel array 10 which are selected for reading-out. The analog-to-digital converter comprises group/column ADC circuits 120a, 120b, ..., 120m. Each of the group/column ADC circuits 120a, 120b, ..., 120m is associated to one of the pixel groups/columns 20a, 20b, ..., 20m. The counter circuit 110 is shared between the m pixel groups/columns or the m group/column ADC circuits 120a, 120b, ..., 120m. It should be noted that other components may be located between the group/column bus lines 40a, ..., 40m and the group/column ADC circuits 120a, ..., 120m.

Figure 2:
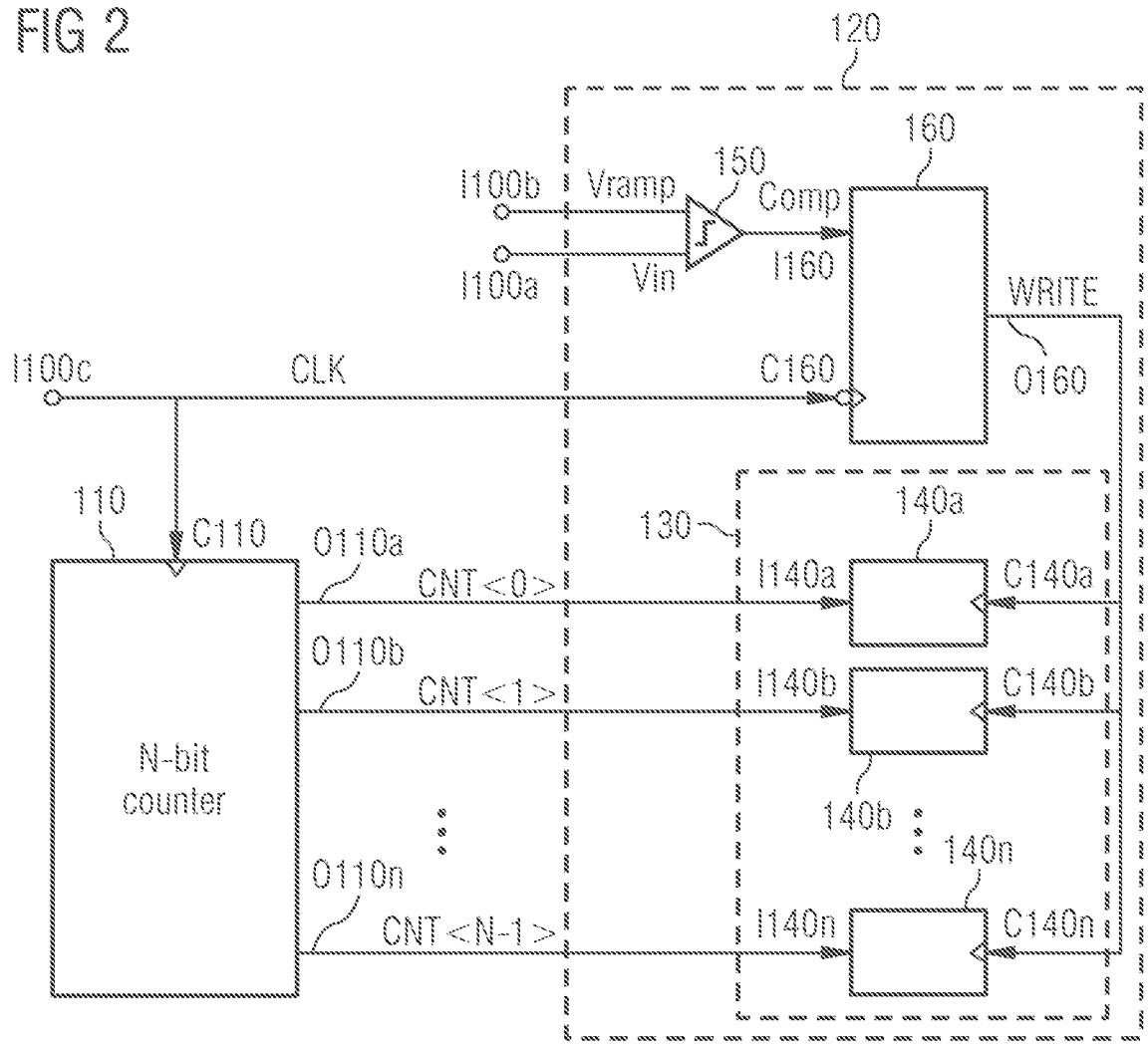
FIG. 2 illustrates a first embodiment of an analog-to-digital converter for an image sensor.

FIG. 2 shows an embodiment of the analog-to-digital converter 100 to read out the voltage levels of the selected pixels 30 of the pixel array 10 of FIG. 1. The analog-to-digital converter 100 is configured as a group-parallel analog-to-digital converter, for example a column-parallel analog-to-digital converter. The analog-to-digital converter 100 comprises an input terminal I100a to apply an input signal Vin provided from the selected pixel column to read out the voltage level of the pixels of the selected row. The analog-to-digital converter 100 further comprises a reference terminal I100b to apply a reference signal Vramp. The reference signal Vramp may be generated by a ramp voltage generator 60 shown in FIG. 1. The analog-to-digital converter 100 further comprises a clock terminal I100c to apply a clock signal CLK.

As further illustrated in FIG. 2, the analog-to-digital converter 100 comprises a counter circuit 110 having a counter control connection C110 to apply the clock signal CLK and a plurality of counter output connections O110a, O110b, ..., O110n to generate a respective counter bit CNT<0>, CNT<1>, ..., CNT<N−1> in response to a counter state of the counter circuit 110. The analog-to-digital converter 100 further comprises a storage circuit 130 comprising a plurality of storage cells 140a, 140b, ..., 140n. A respective one of the storage cells 140a, 140b, ..., 140n is connected to a respective one of the counter output connections O110a, O110, ..., O110n for storing a respective storage state in response to the respective counter bit CNT<0>, CNT<1>, ..., CNT<N−1>.

The analog-to-digital converter 100 comprises a comparator circuit 150 for generating a level of a comparison signal COMP in response to a comparison of the input signal Vin and the reference signal Vramp. As further shown in FIG. 1, the analog-to-digital converter 100 comprises a synchronization circuit 160 having a synchronization input connection 1160 to apply the comparison signal COMP, a synchronization control connection C160 to apply the clock signal CLK and a synchronization output connection O160 to generate a write control signal WRITE for controlling the storing/writing of the respective storage state in the respective storage cell 140a, 140b, ..., 140n. The storing process of the respective storage state in the storage cells may be controlled in various manner, for example in a level-sensitive or an edge-sensitive manner. According to a level-sensitive storing process, writing the storage cells with new counter bits is kept until the comparison signal COMP toggles and then the storing/writing process in the storage cells is stopped. An example of an edge-sensitive writing process is described with reference to FIG. 3.

Figure 3:
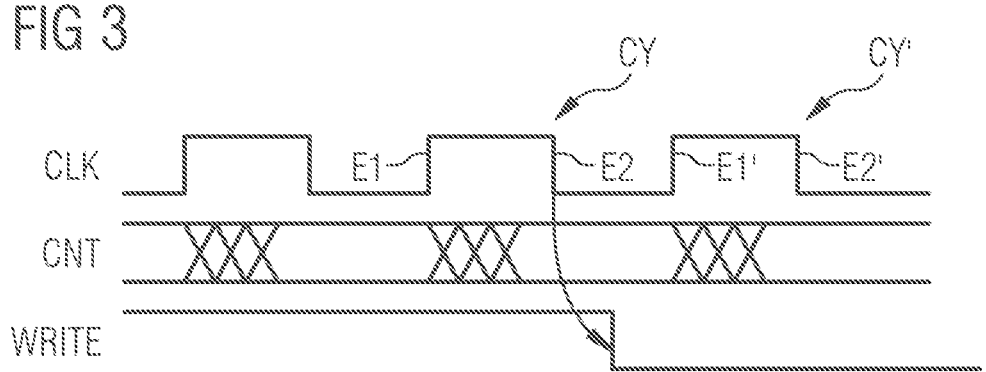
FIG. 3 shows a timing diagram of control signals to control the operation of the analog-to-digital converter.

FIG. 3 illustrates a timing diagram of the clock signal CLK, the write control signal WRITE and the counter bits CNT generated at the counter output connections O110a, O110b, ..., O110n of the counter circuit 110. The counter circuit 110 is configured to change the counter state, when a first edge E1 of a cycle CY of the clock cycle CLK is applied to the control connection C110 of the counter circuit 110. The synchronization circuit 160 is configured to generate the write control signal WRITE in response to a level of the comparison signal COMP, when a second edge E2 of the cycle CY of the clock signal CLK being subsequent to the first edge E1 of the cycle CY of the clock signal CLK is applied to the synchronization control connection C160 of the synchronization circuit 160.

According to the embodiment of the analog-to-digital converter 100 shown in FIG. 2, the counter circuit 110 is configured to provide N counter bits at the counter output connections O110a, O110b, ..., O110n. A new value of the counter bits is generated at the counter output connections on every rising or falling edge of the clock signal CLK. These N counter bits, CNT<0:N−1>, are distributed to M columns of the column ADC circuits 120a, 120, ..., 120m of FIG. 1. For reasons of simplification, FIG. 2 only shows one of column ADC circuits 120 of FIG. 1.

As illustrated in FIG. 3, the synchronization circuit 160 is configured to generate the write control signal WRITE delayed to the second edge E2 of the cycle CY of the clock signal CLK and before a first edge E1' of a second cycle CY' of the clock signal CLK following the cycle CY of the clock signal CLK. When the level of the comparison signal COMP generated by the comparator circuit 150 toggles, i.e. when the ramp signal Vramp crosses the level of the input signal Vin, the comparison signal is synchronized in the synchronization circuit 160 to the opposite edge (rising or falling) of the clock signal CLK. The output write control signal WRITE is then used to latch the counter bits CNT into the storage cells 140a, 140b, ..., 140n.

The proposed architecture of the shared counter column-parallel analog-to-digital converter 100 allows to optimize the layout of the counter circuit 110 with respect to area and power, since it is not constrained to the group/column pitch of the pixel array of the image sensor. Furthermore, the storage circuit 130 typically has fewer transistors than the counter circuit 110, thereby reducing the area of the total analog-to-digital converter. The power consumption is further advantageously reduced, because the elements of the analog-to-digital converter which need the most supply power, i.e. the elements of the counter circuit 110, to generate the low significant counter bits, are shared between m groups/columns of pixels or group/column ADC circuits 120a, 120b, ..., 120m. Moreover, if the synchronization circuit 160 is advantageously designed, there is only activity in the ADC group cells during a toggle of the comparator circuit 130.

Additional advantages are provided by the introduction of the synchronization circuit in the analog-to-digital converter 100. Since the counter bits are sampled on the opposite clock edge of the clock signal CLK, the value of the counter bits in between the counter toggle and the toggle of the write control signal WRITE can still be in transition. This is illustrated in the timing diagram of FIG. 3, where the counter is triggered on the rising edge E1 of the clock signal CLK, while the write control signal WRITE is generated by the synchronization circuit 160 on the falling edge E2 of the clock signal CLK of the same clock cycle.

The counter circuit 110 has advantageously approximately half a clock period time for its outputs to achieve the correct value, which allows using a simple binary ripple counter circuit, at least for the Least Significant Bits of the counter circuit 150. Therefore, according to an advantageous embodiment, the counter circuit 110 is configured as a binary ripple counter circuit. As an advantageous consequence, no additional logic is needed besides a simple toggle-flipflop, as opposed to, for example, a fully synchronous or a Gray code counter. Furthermore, the power consumption of the higher bit cells in the counter circuit 110 is lower.

A fully N-bit ripple counter circuit however still requires N-propagation delays to achieve its value, which is then the main speed limitation of this circuit embodiment. To further increase the speed of the analog-to-digital converter 100, the Most Significant counter Bits could be generated by using a synchronous counter. For example, when the three Least Significant counter Bits are generated with an asynchronous ripple counter and the other N−3 counter bits are generated with a synchronous counter, the counter delay will be only approximately four propagation delays.

Figure 4:
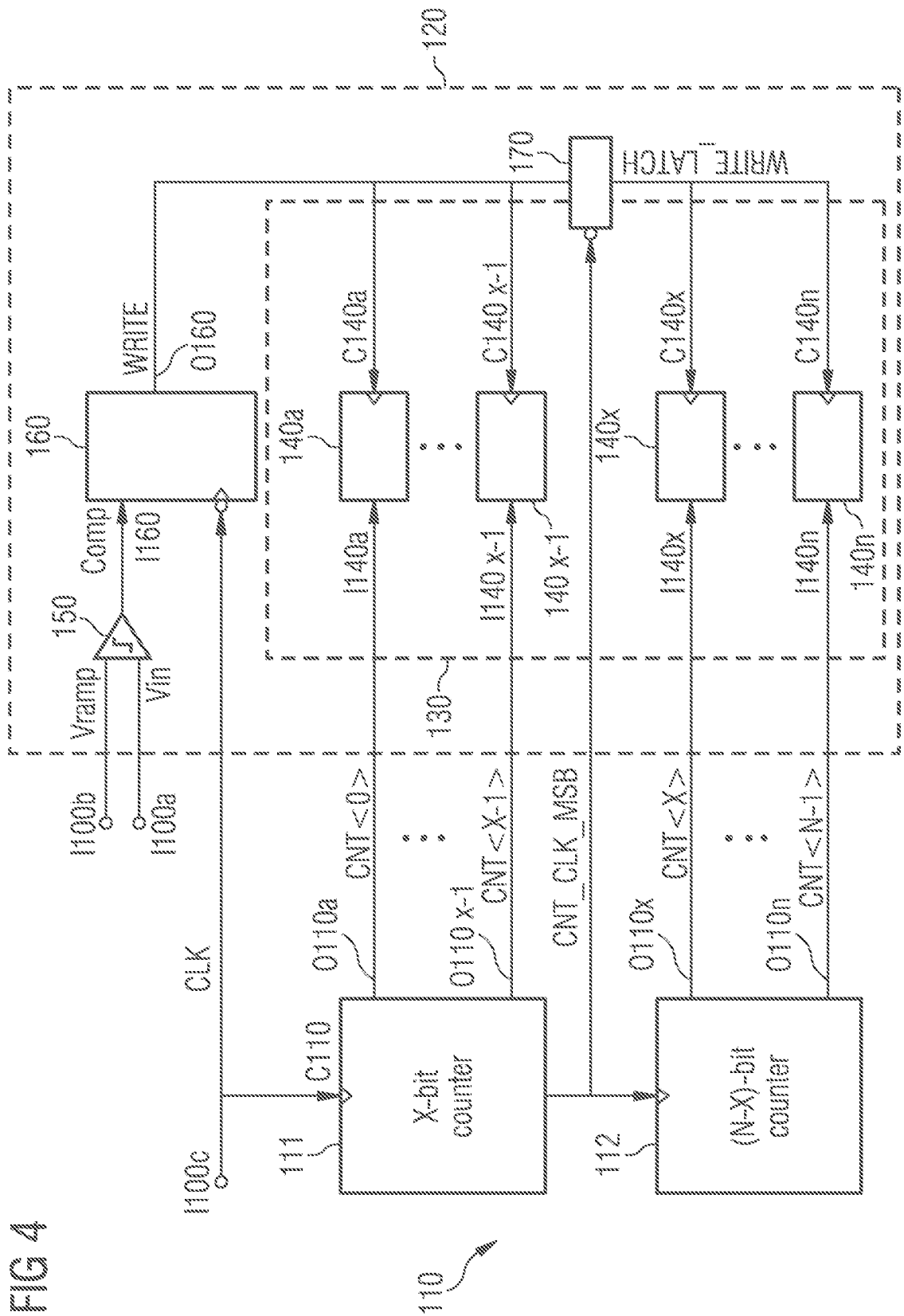
FIG. 4 illustrates a second embodiment of an analog-to-digital converter for an image sensor.

FIG. 4 shows an improved second embodiment of the analog-to-digital converter 100 wherein the counter circuit 110 comprises a first counter circuit portion 111 and at least a second counter circuit portion 112. The first counter circuit portion 111 has a first portion of the counter output connections O110a, ..., O110x−1. The first counter circuit portion 111 is configured to generate a respective Least Significant Bit CNT<0>, ..., CNT<X−1> at a respective counter output connection of the first portion of the counter output connections O110a, ..., O110x−1. The second counter circuit portion 112 has a second portion of the counter output connections O110x, ..., O110n. The second counter circuit portion 112 is configured to generate a respective Most Significant Bit CNT<X>, ..., CNT<N-1> at a respective counter output connection of the second portion of the counter output connections O110x, ..., O110n.

The first counter circuit portion 111 may be configured to change its counter state in response to the clock signal CLK, for example, when a first edge E1 of a clock cycle CY of the clock signal CLK is applied to the counter control connection C110 of the counter circuit 110. The second counter circuit portion 112 may be configured to change its counter state in response to a control signal CNT_CLK_MSB being generated by the first counter circuit portion 111.

As explained above, the first counter circuit portion 111 may be configured as an asynchronous ripple counter, and the second counter circuit portion 112 may be configured as a synchronous ripple counter.

According to a possible embodiment of the analog-to-digital converter 100 illustrated in FIG. 4, the analog-to-digital converter 100 comprises a latch circuit 170 to generate a delayed write control signal WRITE_LATCH. The latch circuit 170 may be embodied to generate the delayed control signal WRITE_LATCH in response to a control signal CNT_CLK_MSB which is generated by the first counter circuit portion 111. The latch circuit 170 is connected to the synchronization output connection O160 of the synchronization circuit 160 so that the write control signal WRITE is applied to a respective one of the storage cells 140a, ..., 140x-1 connected to a respective one of the first portion of the counter output connections O110a, ..., O110x-1, and the delayed write control signal WRITE_LATCH is applied to a respective one of the storage cells 140x, ..., 140n connected to a respective one of the second portion of the counter output connections O110x, ..., O110n.

As illustrated in FIG. 4, the latch circuit 170 is inserted in between the path of the write control signal WRITE for controlling the storage cells 140a, ..., 140x-1 for storing the Least Significant counter Bits and the path to transmit the delayed write control signal WRITE_LATCH to control the storage of the Most Significant counter Bits in the storage cells 140x, ..., 140n. The latch circuit 170 allows the write control signal WRITE for storing the Most Significant counter Bits in the storage cells 140x, ..., 140n to be delayed when the MSB counter bits toggle on a rising edge of a control signal CNT_CLK_MSB generated by the first counter circuit portion 111 and being used as MSB clock signal.

This gives the second/MSB counter circuit portion 112 more time to settle, which makes it possible to also use an asynchronous ripple counter in the second counter circuit portion 112 for generating the Most Significant counter Bits. It also allows to make the design of the counter circuit easier, at the cost of a slight increase in area (for the latch circuit 170) and a slightly higher power consumption compared to a regular ripple counter, since the control signal CNT_CLK_MSB is distributed to all columns. Furthermore, the power consumption is still much lower than in the case where a synchronous counter is used for generating the Most Significant counter Bits.

Figure 5:
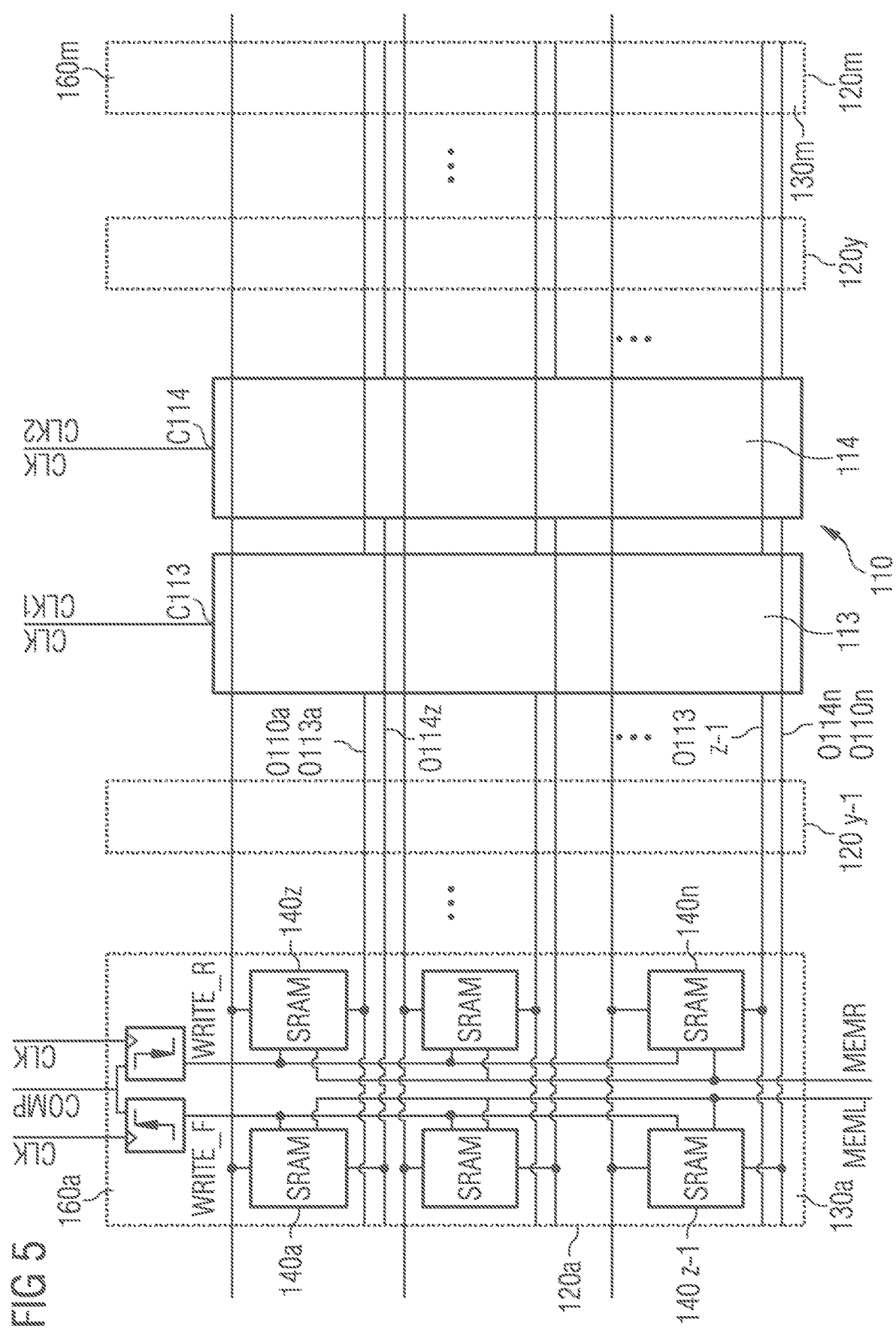
FIG. 5 illustrates an embodiment of a possible architecture of an analog-to-digital converter for reading out voltage levels of an array of pixels of an image sensor.

FIG. 5 shows an architecture of an analog-to-digital converter 100 which is embodied to read out voltages of an array of pixels. The analog-to-digital converter comprises a plurality of group ADC circuits 120a, ..., 120y-1, 120y, ..., 120m, for example column ADC circuits. Each of the group/column ADC circuits is associated to a respective pixel group, for example a pixel column, of a pixel array not shown in FIG. 5. Each of the group/column ADC circuits 120a, ..., 120m comprises a respective storage circuit 130a, ..., 130m and a respective synchronization circuit 160a, ..., 160m. Each of the storage circuits 130a, ..., 130m and each of the synchronization circuits 160a, ..., 160m is associated to a respective one of the pixel group/columns.

The analog-to-digital converter 100 comprises a shared counter circuit 110 which provides its counter bits to each of the group/column ADC circuits 120a, ..., 120m and, in particular, to each of the storage cells 140a, ..., 140n inside the group/column ADC circuits 120a, ..., 120m. In particular, the counter output connections of the counter circuit 110 are connected to each of the storage cells 140a, ..., 140n of the storage circuits 130a, ..., 130m of each of the group/column ADC circuits 120a, ..., 120m.

According to the embodiment of the analog-to-digital converter 100 shown in FIG. 5, the counter circuit 110 comprises a first counter circuit unit 113 and a second counter circuit unit 114. For every group/column ADC circuit 120a, ..., 120m and thus for every storage circuit 130a, ..., 130m there is a shared dual counter circuit comprising the first counter circuit unit 113 and the second counter circuit unit 114. The first counter circuit 113 and the second counter circuit 114 may be embodied as shown in FIG. 5, i.e. the first and the second counter circuit 113 and 114 may respectively comprise the first counter circuit portion 111 and the second counter circuit portion 112.

As shown in FIG. 5, the counter output connections O113a, ..., O113z-1 of the first counter circuit unit 113 are connected to a first portion of the storage cells 140a, ..., 140z-1 of each of the storage circuits 130a, ..., 130m. Furthermore, the counter output connections O114z, ..., O114n of the second counter circuit unit 114 are connected to a second portion of the storage cells 140z, ..., 140n of the storage circuits 130a, ..., 130m.

According to the embodiment of the analog-to-digital converter 100 of FIG. 5, the first counter circuit unit 113 is configured to change, for example increase or decrease, its counter state, when a first edge, for example a rising edge, of a clock cycle of the clock signal CLK is applied to a control connection C113 of the first counter circuit unit 113. The second counter circuit unit 114 is configured to change, for example increase or decrease, its counter state, when a second edge, for example a falling edge, of the clock cycle of the clock signal CLK being opposite to the first edge of the clock signal is applied to a control connection C114 of the second counter circuit unit 114.

An advantage of this ADC architecture is that a speed factor of 2 can easily be gained. This is possible by duplicating the counter circuit 110 to the first counter circuit unit 113 and the second counter circuit unit 114, but clocking the counter circuit units 113 and 114 on the opposite clock edge. In this case, there would be both a rising edge and a falling edge counter, and the related synchronization circuits 160a, ..., 160m would again generate the write control signal WRITE on the clock edge opposite to the clock signal applied to the counter circuit.

This concept of multiple counters could be extended further by having clock signals for the counter circuit units that are out of phase, for example 0, 90, 180 and 270 degrees phase-shifted clock signal, thereby increasing the speed of the analog-to-digital converter with a factor equal to the number of phase shifts, at the cost of increased area and power. Accordingly, the architecture of the analog-to-digital converter shown in FIG. 5 has to be modified in that instead of using the clock signal CLK as a control signal at the control connections C113 and C114 at least a first clock signal CLK1 is applied to the control connection C113 of the first counter circuit unit 113 and at least a second clock signal CLK2 is applied to the control connection C114 of the second counter circuit unit 114. The at least first and second clock signals are phase-shifted to each other.

Referring to the embodiment of the analog-to-digital converter 100 of FIG. 5, the first and second counter circuit units 113 and 114 are located in the center of the counter kernel and distribute their counter bits to the column ADC circuits 120a, . . . , 120m. One of the counter circuit units may be configured to toggle on the rising edge of the clock signal CLK, and the other one on the falling edge of the clock signal CLK to decrease the counter frequencies. According to the embodiment of the analog-to-digital converter 100 of FIG. 5, the storage circuits 130a, . . . , 130m feature two SRAM cells for every bit of the counter circuit 110. The SRAM cells 140a, . . . , 140n are written at an edge of the comparison signal COMP so the pulse of the write control signal WRITE is synchronized to the opposite edge of the counter for which the value is written. After the conversion, the values stored in the SRAM cells are read out on output buses MEML, MEMR and further processed.

A further improvement to the architecture of the analog-to-digital converter 100 of FIG. 5 allows the use of a ripple counter in all bits of the counters, significantly reducing the power consumption of the ADC. As shown in FIG. 4, a latch circuit can be inserted in the path to transmit the write control signal WRITE to provide a delayed write control signal WRITE_LATCH to the MSB storage cells. The latch circuit makes sure that the control signal for storing a counter bit in the MSB storage cells is delayed when the MSB counter bits toggle on a rising edge of the control signal CNT_CLK_MSB (FIG. 4). This gives the MSB counter circuit portion more time to settle and make the design of the counter circuit easier, at the cost of a slight increase in area (for the latch circuit) and a slightly higher power consumption compared to a regular ripple counter, since the control signal CNT_CLK_MSB is distributed to all columns. The power consumption is still much lower than for the case where a synchronous counter is used for the MSB counter circuit portion.

Figure 6:
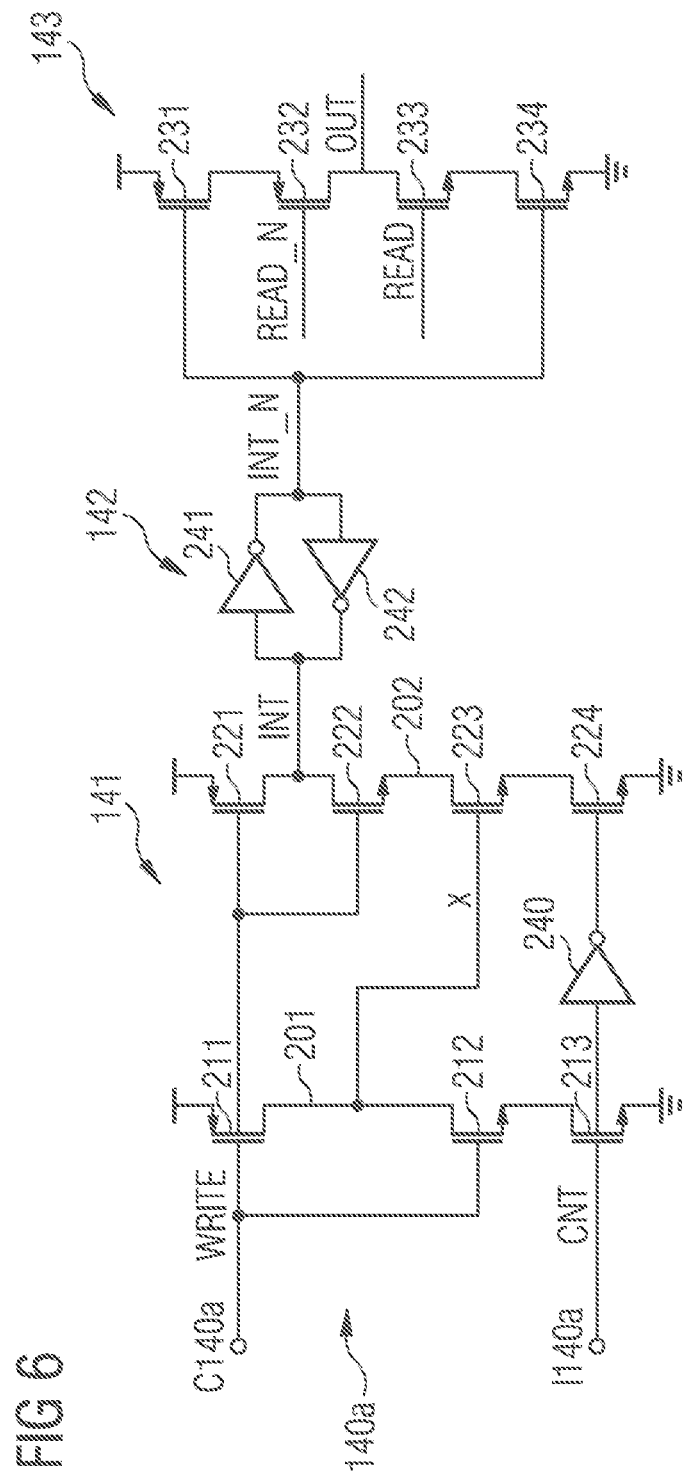
FIG. 6 shows an embodiment of a storage cell of an analog-to-digital converter to store low significant counter bits.

FIG. 6 shows an embodiment of a storage cell, for example the storage cell 140a of the counter circuit portion 111 of FIG. 4 to store one of the Least Significant counter Bits. The storage cell is embodied as a SRAM cell. The SRAM cell has a storage cell input connection I140a to apply a counter bit and a storage cell control connection C140a to apply the write control signal WRITE. As shown in FIG. 6, the storage cell input connection I140a and/or the storage cell control connection C140a are respectively embodied as a single-ended connection.

The storage cell circuit 140a comprises three stages. In the first stage 141, comprising the transistors 211, 212 and 213 of the branch 201, and the transistors 221, 222, 223 and 224 of branch 202 and inverter 240, the storage signal at the internal storage node INT is overwritten, if necessary, when the input signal/counter bit CNT has a low level. The second stage 142 is embodied as a storage element with two back-to-back inverters 241 and 242. In the third stage 143 comprising transistors 231, 232, 233 and 234 of branch 203, the stored value is put on the output bus when the control signal READ is high.

The embodiment of the storage cell shown in FIG. 6 has several advantages. Only a single-ended input needs to be distributed over the memory array, and only a single-ended write control signal is needed, thereby avoiding skew issues. Furthermore, thanks to the use of dynamic logic, the load on the input connection I140a is quite small, i.e. by providing only one inverter and an additional transistor. Moreover, when the write control signal WRITE is stable, power is only consumed by the inverter 240. The power consumption before and after toggling of the write control signal is identical. Furthermore, the setup time of the input signal CNT with respect to the rising edge of the write control signal WRITE can be very small. Moreover, the overall transistor count of the storage cell architecture is quite low.

The operation of the first stage 141 (overwrite logic) is as follows. When the write control signal WRITE is low, the storage signal at the internal storage node INT is reset to high. The write control signal WRITE is high, node X is pulled low if the input signal CNT is high. In this case, the reset value of the storage signal at the internal node INT is not overwritten, since the two bottom transistors 223 and 224 in the second branch 202 will be cut off, and a high level "1" of the storage signal is stored. The bottom transistor is needed to avoid overwriting the reset value of the storage signal at the internal storage node INT when the potential at the node X is still transitioning. When the write control signal WRITE goes high and the input signal CNT is low, node X will stay at the high level and the internal storage node INT will be pulled low, thus storing a low level "0" of the storage signal.

Figure 7:
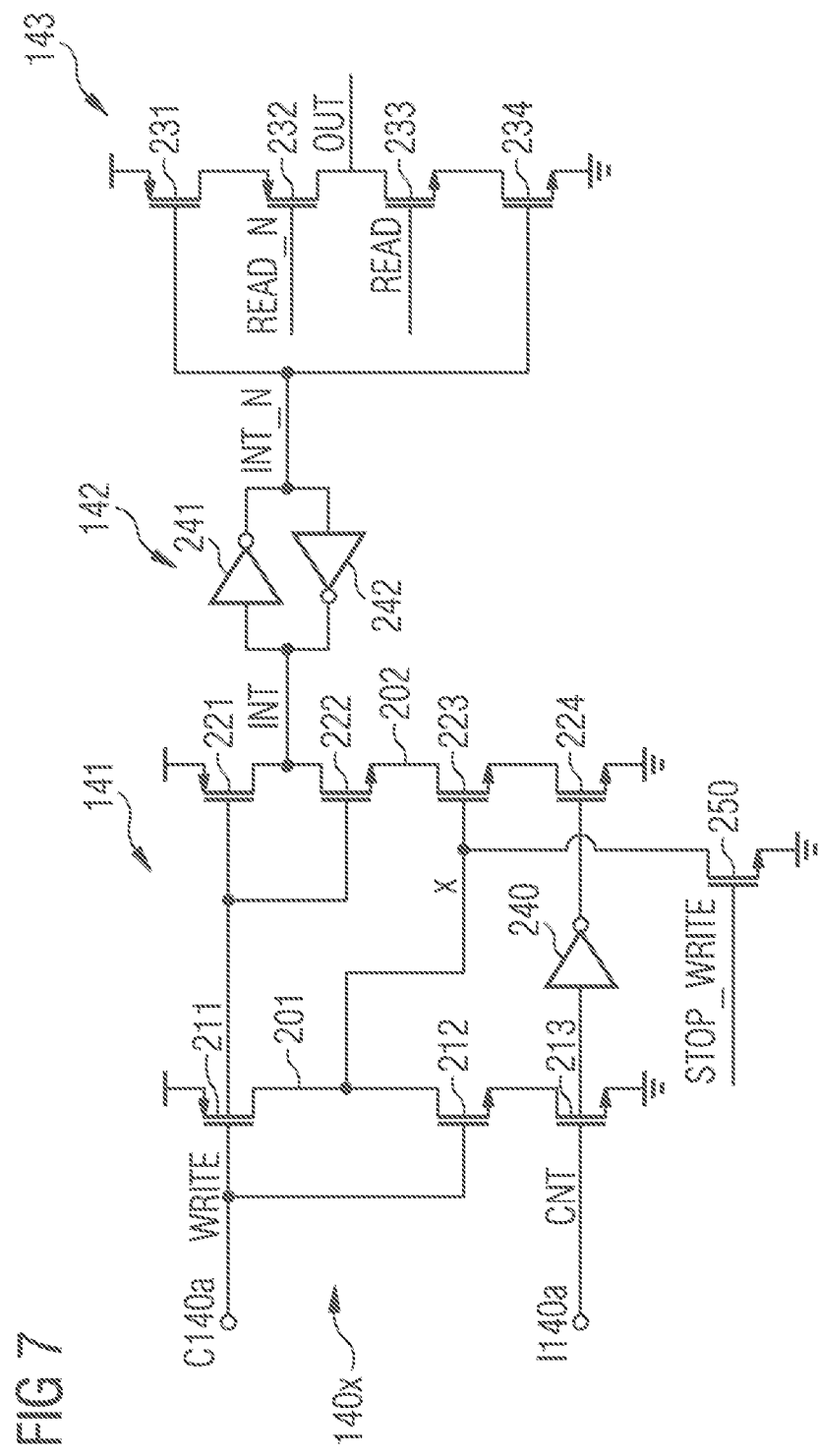
FIG. 7 shows an embodiment of a storage cell of an analog-to-digital converter to store Most Significant counter Bits.

As shown in FIG. 7, the storage cells for storing the Most Significant counter Bits are slightly different, with an additional pull-down transistor 250 and a STOP_WRITE signal applied to a control connection of transistor 250. This STOP_WRITE signal should only go high when the cell has been written, i.e. a certain time after the rising edge of the write control signal WRITE. To avoid a large static power consumption, it should also be low when the write control signal WRITE toggles low again.

Pulling down the X node after latching makes sure that the internal storage node INT cannot be overwritten when the input signal/counter bit CNT is low for a long time. The STOP_WRITE signal is generated from the delayed write control signal WRITE_LATCH using an AND gate. This AND gate makes sure that the STOP_WRITE signal is low when the delayed write control signal WRITE_LATCH is low, and that the storage cells can always be written. The delay of the AND gate makes sure that there is enough time for the storage cell to be overwritten.

Figure 8:
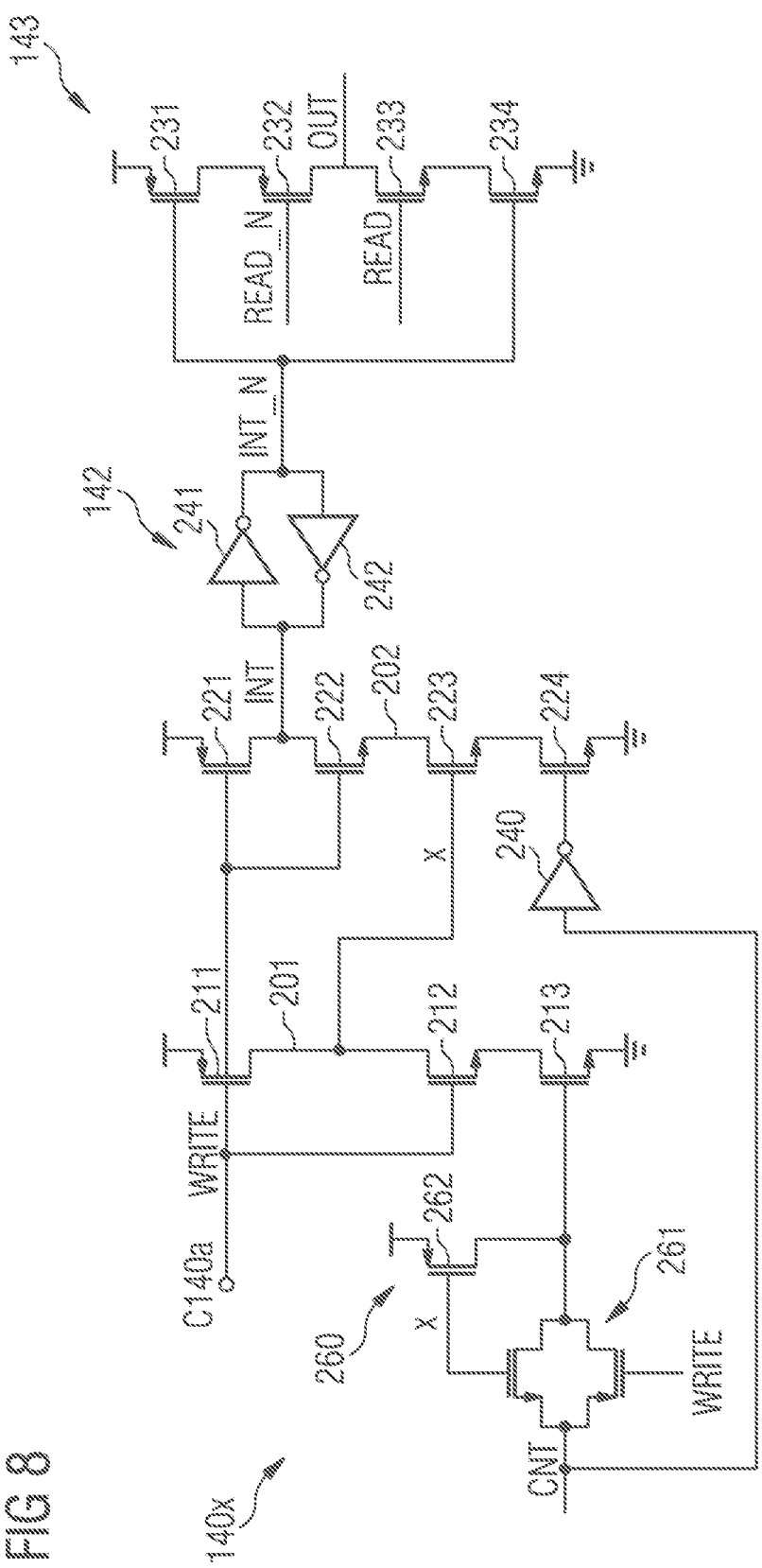
FIG. 8 shows another embodiment of a storage cell of an analog-to-digital converter to store Most Significant counter Bits.

A modified embodiment of a storage cell comprising an alternative to the STOP_WRITE signal is shown in FIG. 8. In this implementation, overwriting the internal storage node INT is avoided internally in the SRAM cell, and does not rely on the external write control signal WRITE. The solution requires two additional transistors, however inside each SRAM cell.

Figure 9:
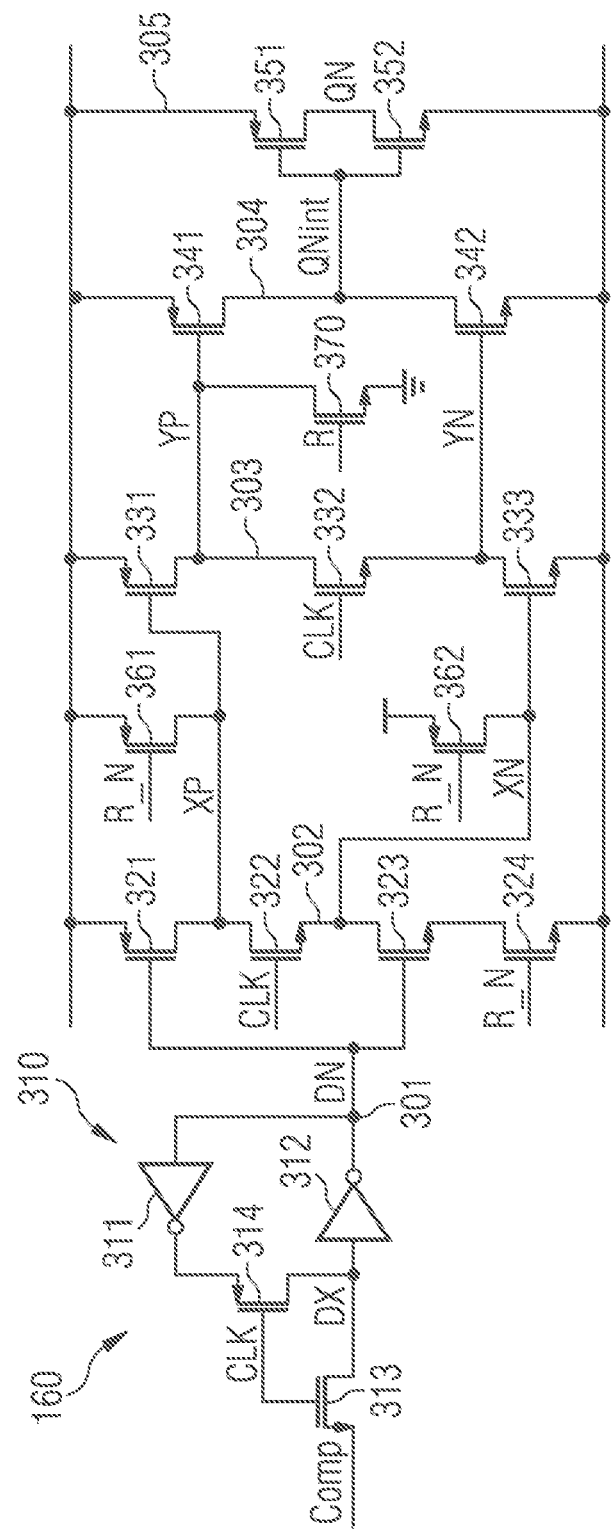
FIG. 9 shows an embodiment of a synchronization circuit of an analog-to-digital converter.

FIG. 9 shows an embodiment of the synchronization circuit 160 which comprises a split-out True Single Phase Clock (TSPC) flipflop. According to the illustrated embodiment, the synchronization circuit 160 is configured as a rising edge split-out TSPC flipflop. As shown in FIG. 9, the synchronization circuit 160 comprises an input path 301 comprising a latch 310 with back-to-back inverters 311 and 312 and transistors 313 and 314. The synchronization circuit further comprises a current path 302 including transistors 321, 322, 323 and 324, and a current path 303 including transistors 331, 332 and 333. The synchronization circuit further comprises transistors 361 and 362 arranged between the current path 302 and 303. The synchronization circuit further comprises a current path 304 including transistors 341 and 342 and a transistor 370 arranged between the current paths 303 and 304. The synchronization circuit comprises an output current path 305 comprising transistors 351 and 352.

The use of a split-output flipflop has two important advantages. Firstly, it has a minimal CLK load of only two transistors. As the clock signal CLK is a signal with the highest speed, this results in a lower power consumption compared to other flipflops. Secondly, when the input signal/comparison signal COMP is stable, there is no power consumption in the flipflop. The flipflop only consumes power during a transition on the input connection to apply the comparison signal COMP, which is not the case for other (TSPC) flipflops. Since the comparison signal COMP only toggles twice during a row time, this results again in a power advantage and avoids power consumption differences before and after toggling of the comparison signal.

Referring to FIG. 9, the comparison signal COMP is first latched on the opposite clock edge of the clock signal CLK. This is done to avoid metastability issues in the later part of the flipflop, since there is no control over the setup time of the flipflop. If the setup time would not be respected, the QN output could potentially toggle while the counter bits are still changing. This is a critical situation that should be avoided.

Referring to the architecture of the analog-to-digital converter 100 of FIG. 5, the embodiment of the rising edge TSPC flipflop shown in FIG. 9 may be used for the implementation of the write detection of the counter circuit unit 114. For the write detection of the counter circuit unit 113, a falling edge version of the same flipflop can be easily constructed. In this case, the output is set to a high level "1" upon reset. Thus, no additional inverter is needed and the Q output can be connected to the write control signal.

Figure 10:
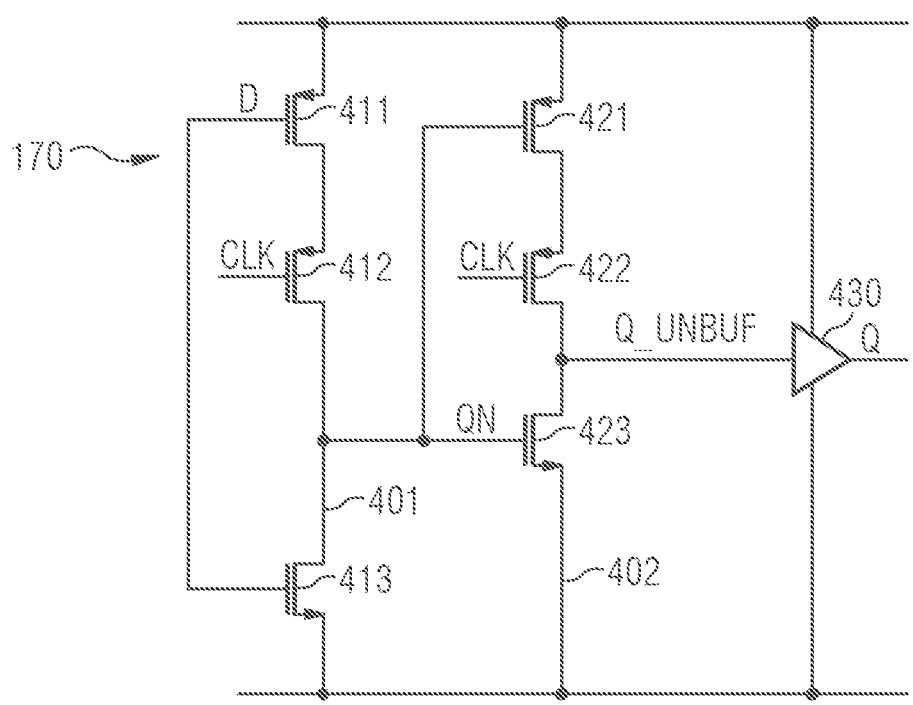
FIG. 10 shows an embodiment of a latch circuit of an analog-to-digital converter.

FIG. 10 shows an embodiment of the latch circuit 170 that gates the write control signal WRITE on the high phase of the control signal CNT_CLK_MSB. The latch circuit may be configured as a negative TSPC latch. The TSPC latch for the write control signal comprises a current path 401 comprising transistors 411, 412 and 413, and a current path 402 comprising transistors 421, 422 and 423. The current path 402 is connected to an output inverter 430.

Figure 11:
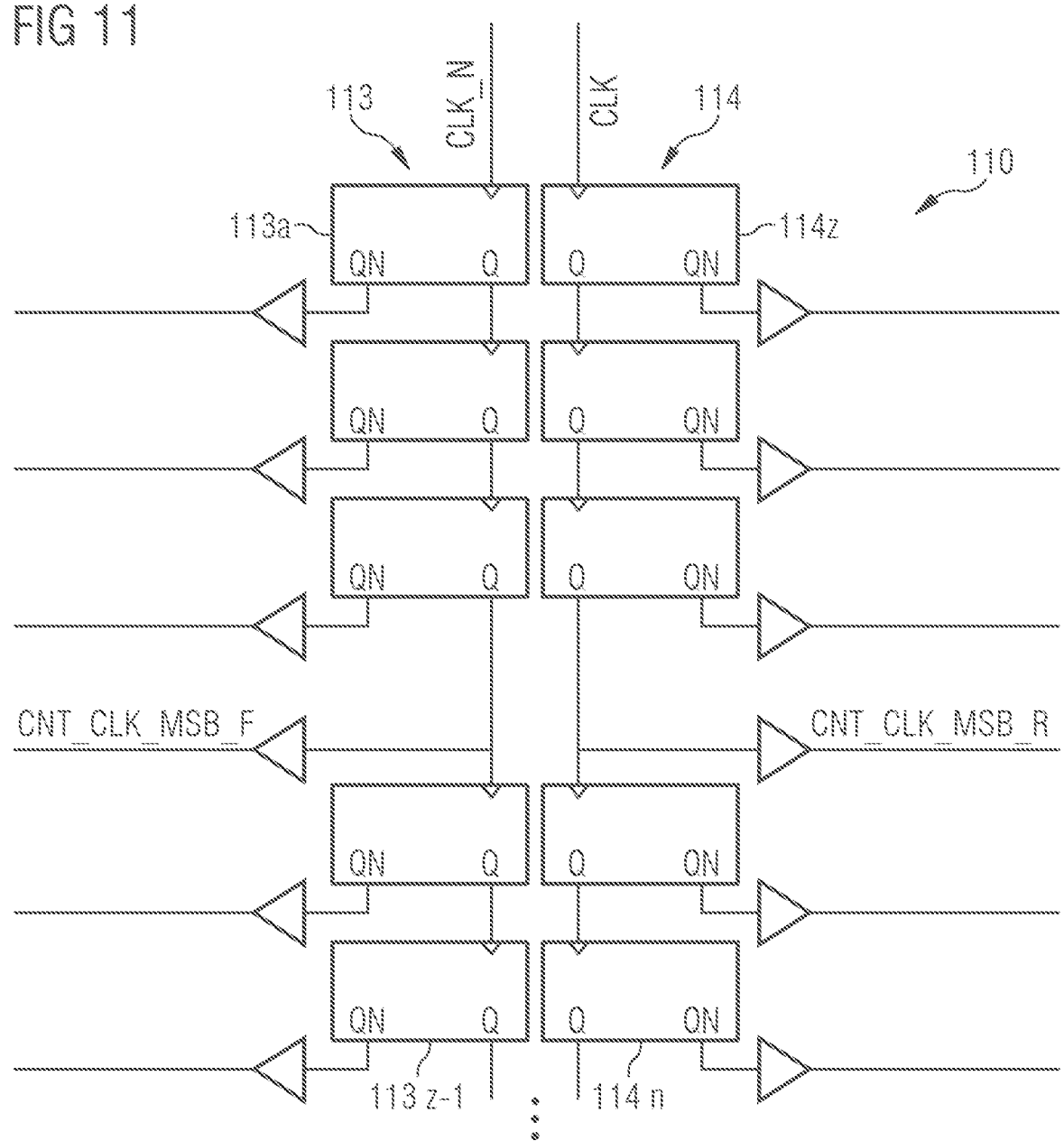
FIG. 11 illustrates an architecture of a counter circuit of an analog-to-digital converter.

The architecture for the counter circuit 110 is shown in FIG. 11. The complementary clock signals CLK and CLK_N are used as clock signals for an asynchronous ripple counter comprising the counter circuit unit 113 with toggle flipflops 113a, ..., 113z-1, and the counter circuit unit 114 including toggle flipflops 114z, ..., 114n. According to the embodiment of the counter circuit shown in FIG. 11, only rising edge flipflops are used in both counter circuit units 113 and 114. Finally, in both counter circuit units the clock signal of one of the counter cells, for example the third counter cell (bit 3), is also sent to the storage cells to latch the write control signal for the storage cells storing the Most Significant counter Bits.

Figure 12:
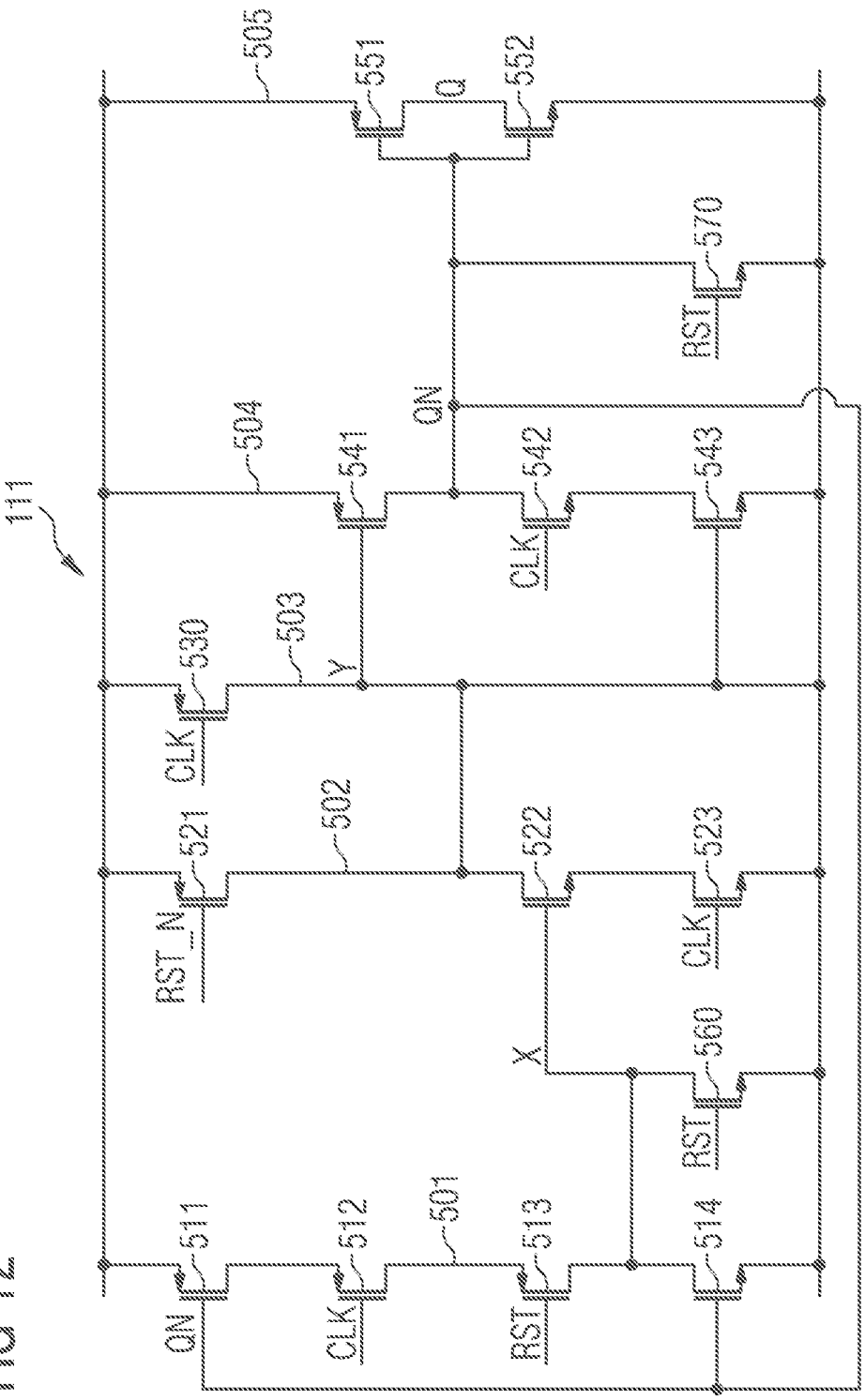
FIG. 12 shows an embodiment of a counter cell of a counter circuit of an analog-to-digital converter to generate low significant counter bits.

A different flipflop configuration is used for the counter circuit portion to generate the Least Significant counter Bits than in the counter circuit portion to generate the Most Significant counter Bits. The counter circuit portion 111 to generate the Least Significant counter Bits has a much higher operating frequency and is therefore optimized for speed and power consumption. A possible embodiment of the counter circuit portion 111 to generate the Least Significant counter Bits is shown in FIG. 12. The counter circuit portion 111 comprises a current path 501 including transistors 511, 512, 513, 514, a current path 502 including transistors 521, 522 and 523, a current path 503 including transistor 530, a current path 504 including transistors 541, 542 and 543, and an output current path 505 including transistors 551 and 552. A transistor 560 is arranged between the current path 501 and 502. Another transistor 570 is arranged between current paths 504 and 505.

To have the smallest load on internal nodes, no holder circuits are placed in the circuit configuration of the counter circuit portion 111. This also means that, due to the dynamic nature of the TSPC flipflop, the circuit needs a minimal operating frequency in order to retain its state. As shown in FIG. 12, the counter circuit portion 111 can be realized as a rising edge TSPC flipflop. A rising edge flipflop may be advantageously chosen since it has the smallest CLK load, because there are no PMOS transistor in series arranged in the delay path.

Regarding the counter circuit portion 112 to generate the Most Significant counter Bits, the operating frequency is much lower, and the additional load of holder circuits will not influence the total power consumption much.

Figure 13:
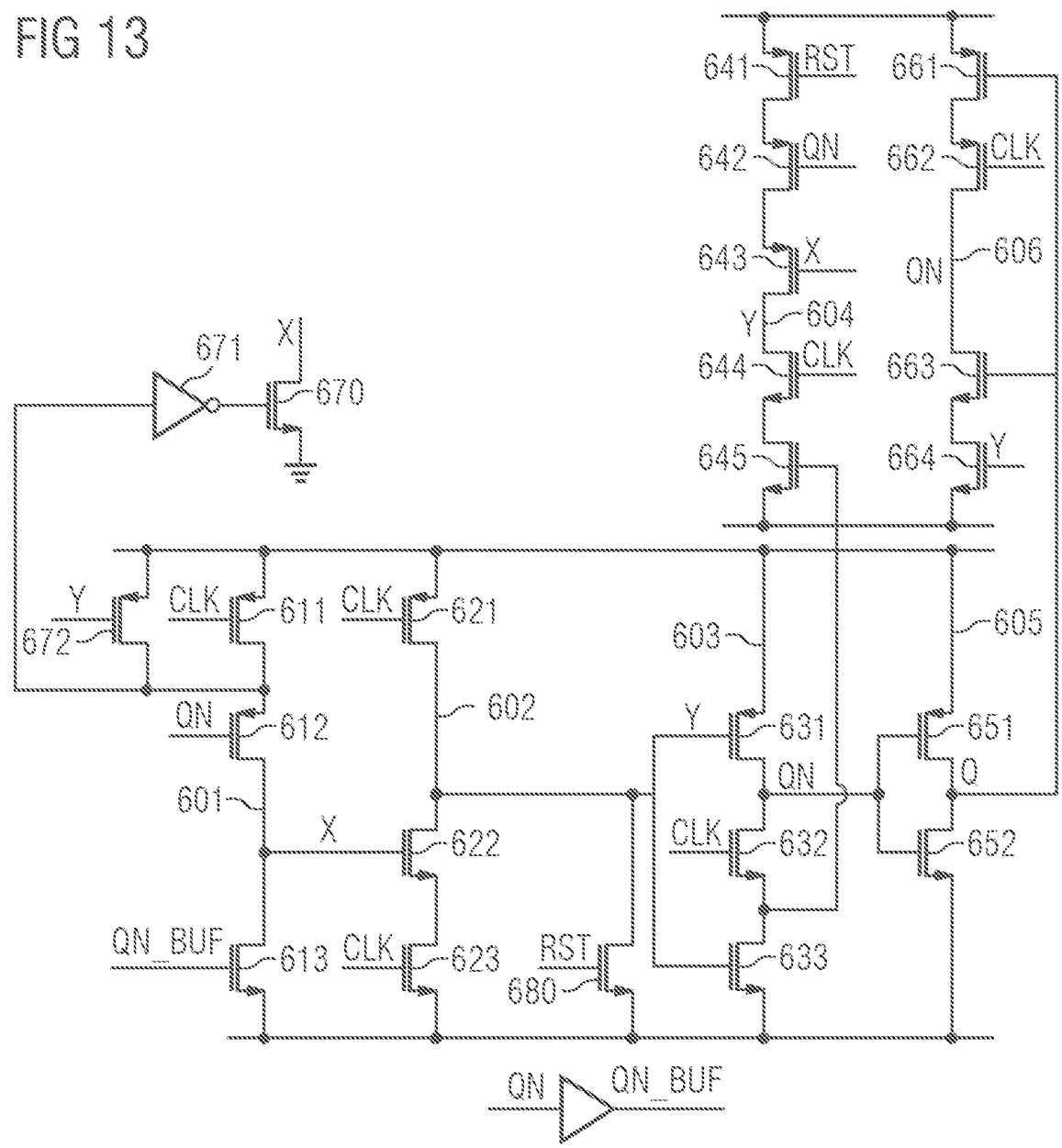
FIG. 13 shows an embodiment of a counter cell of a counter circuit of an analog-to-digital converter to generate Most Significant counter Bits.

An embodiment of a toggle flipflop circuit for the counter circuit portion 112 to generate the Most Significant counter Bits is shown in FIG. 13. The flipflop circuit comprises a current path 601 including transistors 611, 612 and 613, a current path 602 with transistors 621, 622 and 623, and a current path 603 including transistors 631, 632 and 633. The flipflop circuit further comprises a current path 604 comprising transistors 641, 642, 643, 644 and 645, a current path 605 with transistors 651 and 652, and a current path 606 including transistors 661, 662, 663 and 664. The flipflop circuit further comprises a transistor 670, an inverter 671, a transistor 672 coupled to the current path 601, and a transistor 680 arranged between current paths 602 and 603. Because the clock frequency of the flipflop circuit for the counter circuit portion 112 is much lower than the ADC clock frequency, hold circuits are introduced on the dynamic X, Y and QN nodes shown in FIG. 13, in order to retain the state, when the clock signal is not switching.

The invention claimed is:

1. An analog-to-digital converter for an image sensor, comprising:
   a counter circuit having a counter control connection to apply a clock signal and a plurality of counter output connections to generate a respective counter bit in response to a counter state of the counter circuit,
   a storage circuit comprising a plurality of storage cells, wherein a respective one of the storage cells is connected to a respective one of the counter output connections for storing a respective storage state in response the respective counter bit,
   a comparator circuit for generating a level of a comparison signal in response to a comparison of an input signal and a reference signal,
   a synchronization circuit to apply the comparison signal and the clock signal and to generate a write control signal for controlling the storing of the respective storage state in the respective storage cell,
   a latch circuit to generate a delayed write control signal, wherein the counter circuit is configured to change the counter state, when a first edge of a cycle of the clock signal is applied to the counter control connection of the counter circuit,
   wherein the synchronization circuit is configured to generate the write control signal in response to a level of the comparison signal, when a second edge of the cycle of the clock signal being subsequent to the first edge of the cycle of the clock signal is applied to the synchronization circuit, wherein the counter circuit comprises a first counter circuit portion and at least a second counter circuit portion, wherein the first counter circuit portion has a first portion of the counter output connections, the first counter circuit portion being configured to generate a respective Least Significant Bit at a respective counter output connection of the first portion of the counter output connections, wherein the second counter circuit portion has a second portion of the counter output connections, the second counter circuit portion being configured to generate a respective Most Significant Bit at a respective counter output connection of the second portion of the counter output connections, wherein the latch circuit is connected to the synchronization circuit so that the write control signal is applied to a respective one of the storage cells connected to a respective one of the first portion of the counter output connections, and the delayed write control signal is applied to a respective one of the storage cells connected to a respective one of the second portion of the counter output connections.

2. The analog-to-digital converter of claim 1, wherein the synchronization circuit is configured to generate the write control signal delayed to the second edge of the cycle of the clock signal and before a first edge of a subsequent cycle of the clock signal following the cycle of the clock signal.

3. The analog-to-digital converter of claim 1, wherein the counter circuit is configured as a ripple counter circuit.

4. The analog-to-digital converter of claim 1, wherein the respective storage state is stored in the respective storage cell, when the write control signal is applied to the respective storage cell.

5. The analog-to-digital converter of claim 1, wherein the first counter circuit portion is configured as an asynchronous ripple counter, and wherein the second counter circuit portion is configured as a synchronous ripple counter.

6. The analog-to-digital converter of claim 1, wherein the synchronization circuit comprises a split-out True Single Phase Clock flipflop.

7. The analog-to-digital converter of claim 1, wherein the storage cells are embodied as SRAM cells, wherein the SRAM cells respectively have a storage cell input connection to apply a respective one of the counter bits and a storage cell control connection to apply the write control signal, wherein the storage cell input connections and/or the storage cell control connections respectively are embodied as a single-ended connection.

8. An image sensor, comprising:
a pixel array including at least two pixel groups, each pixel group comprising a plurality of pixels connected to a respectively associated group bus of that pixel group,
an analog-to-digital converter according to claim 1, the analog-to-digital converter being embodied to read out voltage values of the pixels of the pixel array.

9. The image sensor of claim 8,
wherein the analog-to-digital converter comprises a plurality of the storage circuits,
wherein each of the storage circuits is associated to a respective one of the pixel groups,
wherein the counter output connections of the counter circuit are connected to each of the storage cells of the storage circuits of the analog-to-digital converter.

10. The image sensor of claim 8,
wherein the counter circuit comprises a first counter circuit unit and a second counter circuit unit,
wherein the counter output connections of the first counter circuit unit are connected to a first portion of the storage cells of each of the storage circuits of the analog-to-digital converter,
wherein the counter output connections of the second counter circuit unit are connected to a second portion of the storage cells of the storage circuits of the analog-to-digital converter.

11. The image sensor of claim 10,
wherein the first counter circuit unit is configured to change the counter state, when the first edge of a clock cycle of the clock signal is applied to a control connection of the first counter circuit unit,
wherein the second counter circuit unit is configured to change the counter state, when the second edge of the clock cycle of the clock signal being opposite to the first edge of the clock cycle of the clock signal is applied to a control connection of the second counter circuit unit.

12. The image sensor of claim 10,
wherein at least a first clock signal is applied to a control connection of the first counter circuit unit to change the counter state of the first counter circuit unit, and at least a second clock signal is applied to a control connection the second counter circuit unit to change the counter state of the second counter circuit unit,
wherein the at least first and second clock signals are phase-shifted to each other.

13. The image sensor of claim 8,
wherein the analog-to-digital converter is configured as a column-parallel analog-to-digital converter.

* * * * *